United States Patent
Lee et al.

(10) Patent No.: US 9,054,100 B2
(45) Date of Patent: Jun. 9, 2015

(54) SEMICONDUCTOR DIE AND METHOD OF FORMING SLOPED SURFACE IN PHOTORESIST LAYER TO ENHANCE FLOW OF UNDERFILL MATERIAL BETWEEN SEMICONDUCTOR DIE AND SUBSTRATE

(75) Inventors: JaeHyun Lee, Kyungki-do (KR); KiYoun Jang, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 31 days.

(21) Appl. No.: 13/287,006

(22) Filed: Nov. 1, 2011

(65) Prior Publication Data
US 2013/0105967 A1    May 2, 2013

(51) Int. Cl.
| | |
|---|---|
| H01L 21/00 | (2006.01) |
| H01L 23/498 | (2006.01) |
| H01L 21/48 | (2006.01) |
| H01L 21/56 | (2006.01) |
| H01L 23/00 | (2006.01) |

(52) U.S. Cl.
CPC ...... *H01L 23/49894* (2013.01); *H01L 21/4846* (2013.01); *H01L 21/563* (2013.01); *H01L 24/27* (2013.01); *H01L 2224/16225* (2013.01); *H01L 2224/32225* (2013.01); *H01L 2224/73204* (2013.01); *H01L 2224/73265* (2013.01); *H01L 2924/13091* (2013.01); *H01L 2924/01322* (2013.01); *H01L 2224/48091* (2013.01); *H01L 2224/92125* (2013.01); *H01L 2924/12041* (2013.01); *H01L 2924/1306* (2013.01)

(58) Field of Classification Search
USPC .................. 438/106, 118, 119, 127
See application file for complete search history.

(56) References Cited

U.S. PATENT DOCUMENTS

| | | | |
|---|---|---|---|
| 6,838,758 B1 | 1/2005 | Montiel | |
| 7,102,239 B2 | 9/2006 | Pu et al. | |
| 7,250,637 B2 * | 7/2007 | Shimizu et al. | 257/98 |
| 7,407,833 B2 * | 8/2008 | Wu | 438/108 |
| 7,759,802 B2 | 7/2010 | Miyazaki | |
| 8,294,279 B2 * | 10/2012 | Chen et al. | 257/777 |
| 8,330,266 B2 * | 12/2012 | Yui | 257/692 |
| 2008/0251942 A1 * | 10/2008 | Ohuchi et al. | 257/778 |
| 2010/0271792 A1 | 10/2010 | Choi et al. | |
| 2012/0032322 A1 * | 2/2012 | Lin et al. | 257/737 |
| 2013/0099377 A1 * | 4/2013 | Yu et al. | 257/737 |
| 2013/0113118 A1 * | 5/2013 | Kim et al. | 257/782 |

* cited by examiner

*Primary Examiner* — Sheila V. Clark
(74) *Attorney, Agent, or Firm* — Robert D. Atkins; Patent Law Group: Atkins and Associates, P.C.

(57) ABSTRACT

A semiconductor device has a semiconductor die with composite bump structures over a surface of the semiconductor die. A conductive layer is formed over a substrate. A patterning layer is formed over the substrate. A first portion of the patterning layer is removed to form an opening to expose the substrate and conductive layer. A second portion of the patterning layer is removed to form a sloped surface in the patterning layer extending from a surface of the patterning layer down to the substrate. The sloped surface in the patterning layer can be linear, concave, or convex. The die is mounted to the substrate with the composite bump structures electrically connected to the conductive layer. An underfill material is deposited over the surface of the patterning layer. The sloped surface in the patterning layer aids with the flow of underfill material to cover an area between the die and substrate.

25 Claims, 10 Drawing Sheets

SEMICONDUCTOR DIE AND METHOD OF FORMING SLOPED SURFACE IN PHOTORESIST LAYER TO ENHANCE FLOW OF UNDERFILL MATERIAL BETWEEN SEMICONDUCTOR DIE AND SUBSTRATE

FIELD OF THE INVENTION

The present invention relates in general to semiconductor devices and, more particularly, to a semiconductor device and method of forming a sloped surface in a photoresist layer to enhance flow of underfill material between a semiconductor die and substrate.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional flipchip semiconductor die has a plurality of bumps formed on the active surface of the die. A substrate has a plurality of conductive traces or contact pads formed on a surface of the substrate. A solder resist (SR) layer is formed over the substrate with an opening to expose the conductive traces or contact pads. The SR layer typically has an abrupt edge at the opening. The semiconductor die is mounted to the substrate with the bumps electrically and metallurgically connected to the exposed conductive traces or contact pads on the substrate. An underfill material is deposited over the SR layer and intended to flow into the SR opening for coverage between the semiconductor die and substrate. The abrupt edge of the SR opening creates surface tension that reduces the flow of underfill material into the SR opening. In addition, the edge of the semiconductor die can inhibit the flow of underfill material between the semiconductor die and substrate. The reduced flow of the underfill material into the SR opening causes non-uniform coverage and voids between the semiconductor die and substrate.

SUMMARY OF THE INVENTION

A need exists to enable the flow of underfill material between a semiconductor die and substrate. Accordingly, in one embodiment, the present invention is a method of making a semiconductor device comprising the steps of providing a semiconductor die, forming a plurality of composite bump structures over a surface of the semiconductor die, providing a substrate, forming a conductive layer over the substrate, forming a patterning layer over the substrate, removing a first portion of the patterning layer to form an opening to expose the substrate and conductive layer, removing a second portion of the patterning layer adjacent to the opening to form a sloped surface in the patterning layer extending from a surface of the patterning layer down to the substrate, mounting the semiconductor die to the substrate with the composite bump structures electrically connected to the conductive layer, and depositing an underfill material over the surface of the patterning layer. The sloped surface in the patterning layer aids with the flow of underfill material from the surface of the patterning layer to cover an area between the semiconductor die and substrate.

In another embodiment, the present invention is a method of making a semiconductor device comprising the steps of providing a semiconductor die, providing a substrate, forming a conductive layer over the substrate, forming a patterning layer over the substrate, forming a sloped surface in the patterning layer extending from a surface of the patterning layer down to the substrate, mounting the semiconductor die to the substrate, and depositing an underfill material over the surface of the patterning layer. The sloped surface in the patterning layer aids with the flow of underfill material to cover an area between the semiconductor die and substrate.

In another embodiment, the present invention is a method of making a semiconductor device comprising the steps of providing a semiconductor die, providing a substrate, forming a patterning layer over the substrate, forming a sloped surface in the patterning layer extending from a surface of the patterning layer down to the substrate, mounting the semiconductor die to the substrate, and depositing an underfill material over the surface of the patterning layer. The sloped surface in the patterning layer aids with the flow of underfill material to cover an area between the semiconductor die and substrate.

In another embodiment, the present invention is a semiconductor device comprising a substrate and patterning layer formed over the substrate with a sloped surface in the patterning layer extending from a surface of the patterning layer down to the substrate. A semiconductor die is mounted to the substrate. An underfill material is deposited over the surface of the patterning layer. The sloped surface in the patterning layer aids with the flow of underfill material to cover an area between the semiconductor die and substrate.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
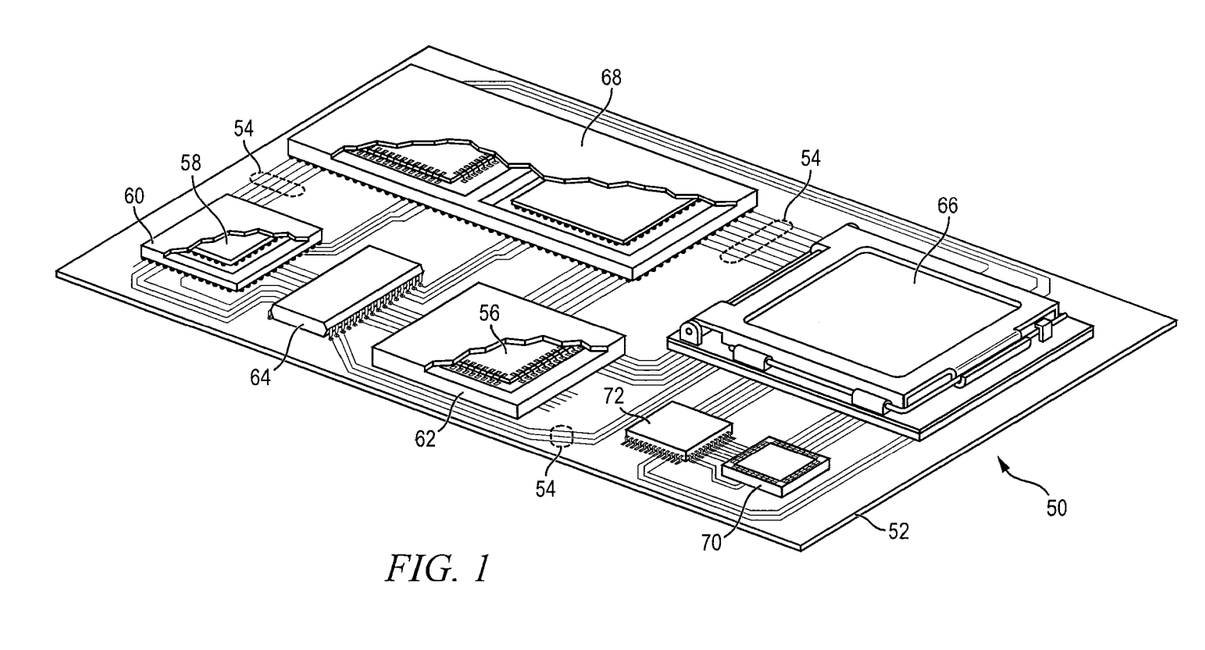
FIG. 1 illustrates a printed circuit board with different types of packages mounted to its surface.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
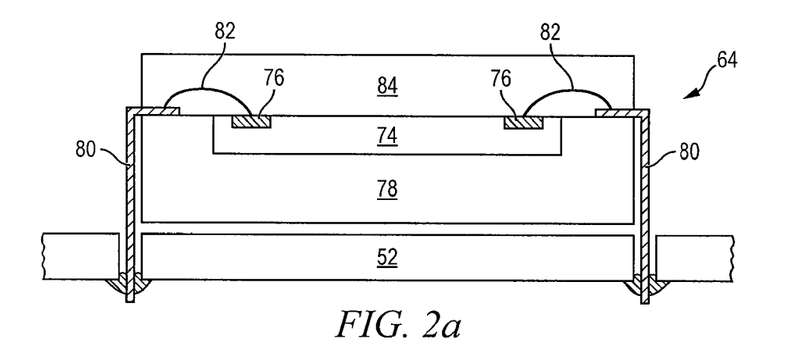
FIGS. 2a-2c illustrate further detail of the representative semiconductor packages mounted to the printed circuit board.
Figure 2B:
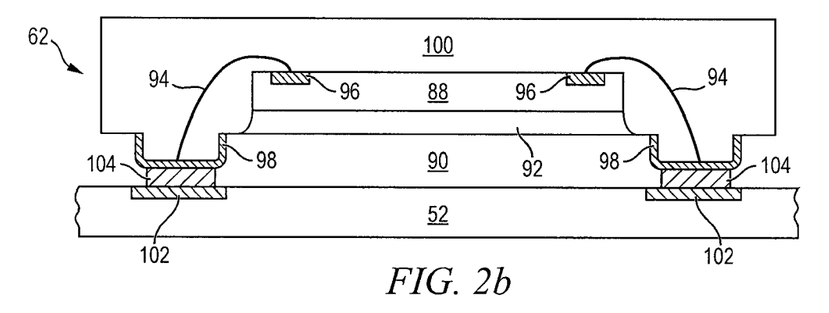
Figure 2C:
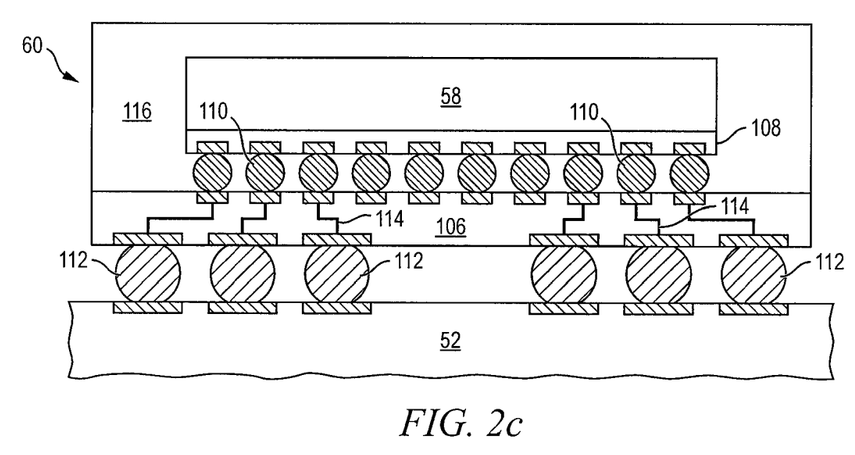

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
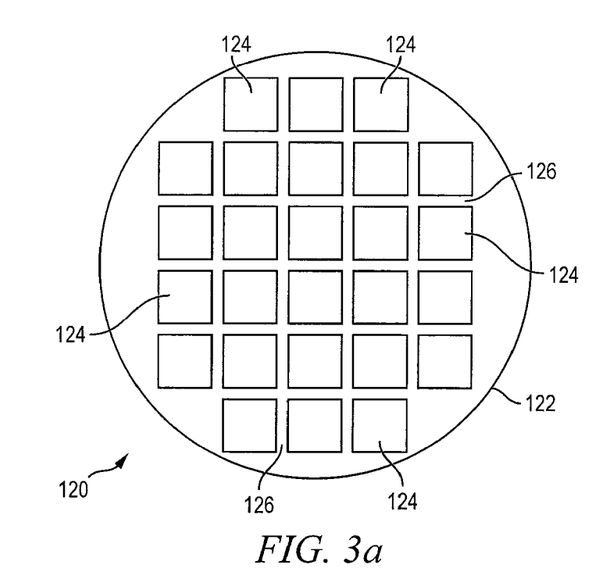
FIGS. 3a-3h illustrate a semiconductor wafer with a plurality of semiconductor die having composite bump structures.

FIGS. 3a-3h illustrate, in relation to FIGS. 1 and 2a-2c, a process of forming a semiconductor wafer with a plurality of semiconductor die having composite bump structures. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
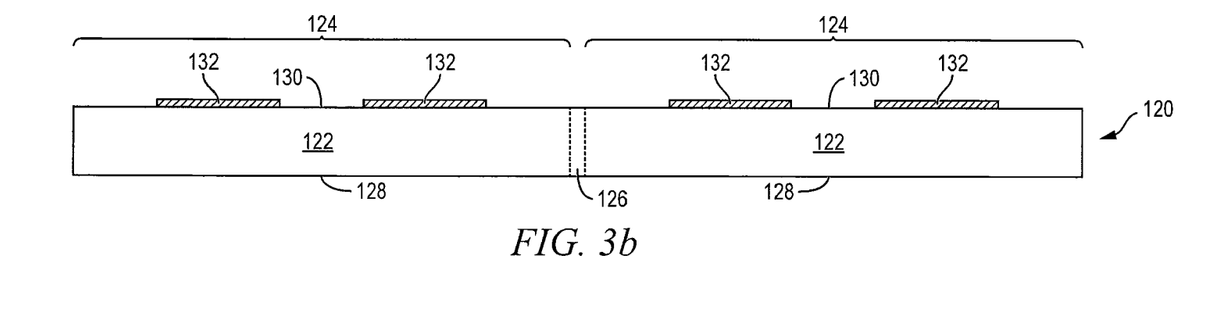

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
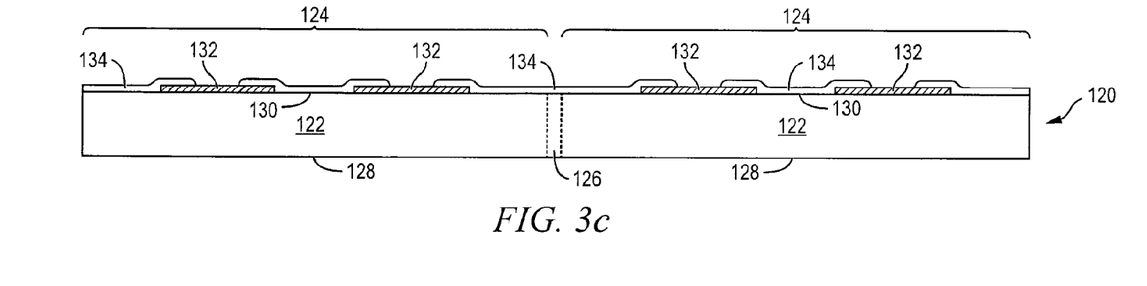

In FIG. 3c, an insulating or passivation layer 134 is conformally applied over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3, or other material having similar insulating and structural properties. The insulating layer 134 follows a contour of active surface 130 and conductive layer 132. A portion of insulating layer 134 is removed by an etching process through a photoresist layer (not shown) to expose conductive layer 132. A portion of conductive layer 132 remains covered by insulating layer 134.

Figures 3D, 3E:
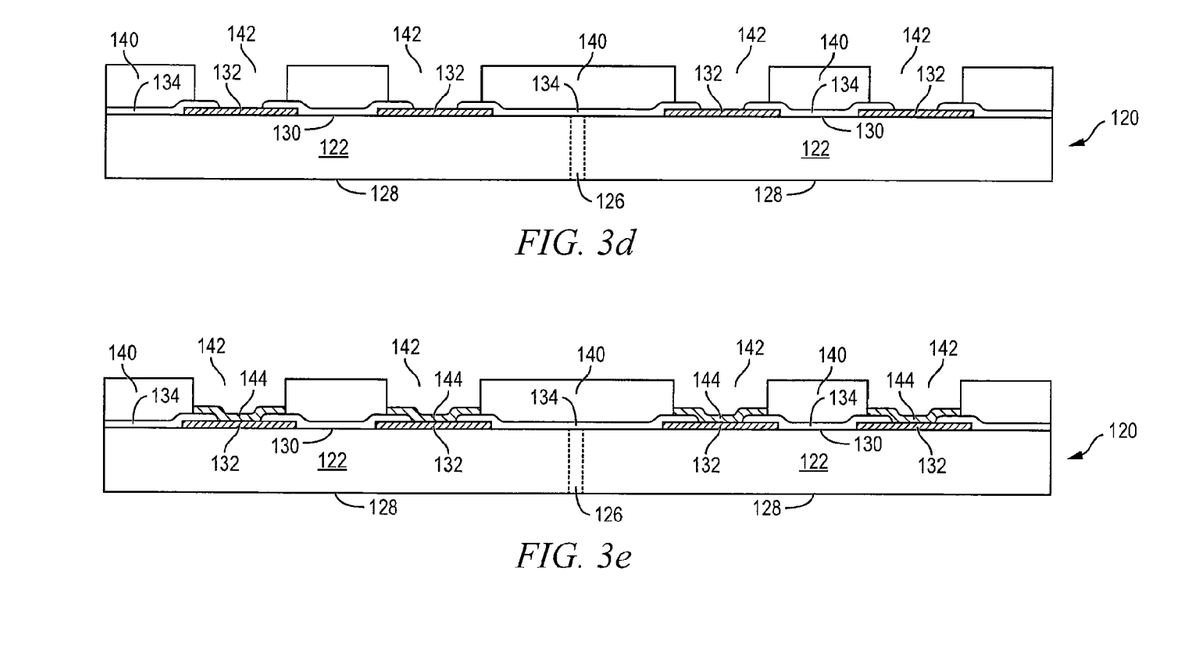

In FIG. 3d, a patterning or photoresist layer 140 is formed over insulating layer 134 and conductive layer 132 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. A portion of photoresist layer 140 is removed by an etching process to form patterned openings 142. The patterned openings 142 expose a portion of insulating layer 134, and are positioned over conductive layer 132. In one embodiment, patterned openings 142 have a circular cross-sectional area configured to form conductive pillars with a cylindrical shape including a circular cross-section. In another embodiment, patterned openings 142 have a rectangular cross-sectional area configured to form conductive pillars with a cubic shape including a rectangular cross-section.

In FIG. 3e, an electrically conductive layer 144 is conformally applied over insulating layer 134 and conductive layer 132, within openings 142, using a patterning and metal deposition process such as printing, PVD, CVD, sputtering, electrolytic plating, and electroless plating. Alternatively, conductive layer 144 can be formed over insulating layer 134 and conductive layer 132 prior to forming photoresist layer 140. Conductive layer 144 can be one or more layers of Al, Cu, Sn, Ti, Ni, Au, Ag, or other suitable electrically conductive material. In one embodiment, conductive layer 144 is a multi-layer stack including a seed layer, barrier layer, and adhesion layer. The seed layer can be titanium copper (TiCu), titanium tungsten copper (TiWCu), or tantalum nitrogen copper (TaNCu).

The barrier layer can be Ni, nickel vanadium (NiV), platinum (Pt), palladium (Pd), TiW, or CrCu, or other suitable material. The adhesion layer can be Ti, TiN, TiW, Al, or chromium (Cr), or other suitable material. Conductive layer 144 follows the contour of insulating layer 134 and conductive layer 132. Conductive layer 144 is electrically connected to conductive layer 132.

Figure 3F:
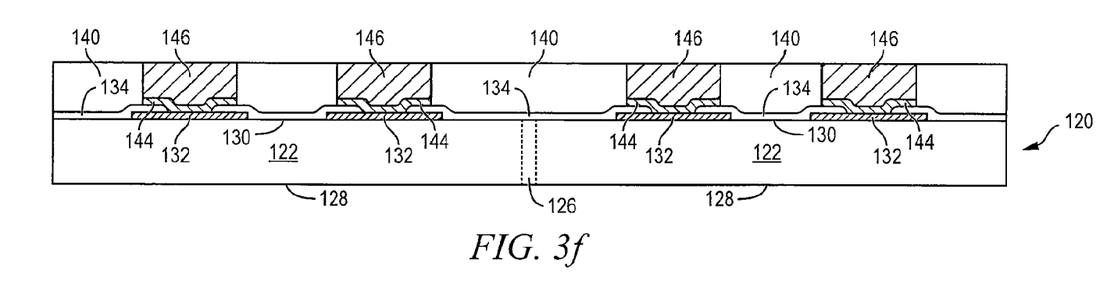

In FIG. 3f, an electrically conductive material 146 is deposited within openings 142 and over conductive layer 144 using an evaporation, sputtering, electrolytic plating, electroless plating, or screen printing process. Conductive material 146 can be Cu, Al, tungsten (W), Au, solder, or other suitable electrically conductive material. In one embodiment, conductive material 146 is deposited by plating Cu in the patterned openings 142 of photoresist layer 140.

Figure 3G:
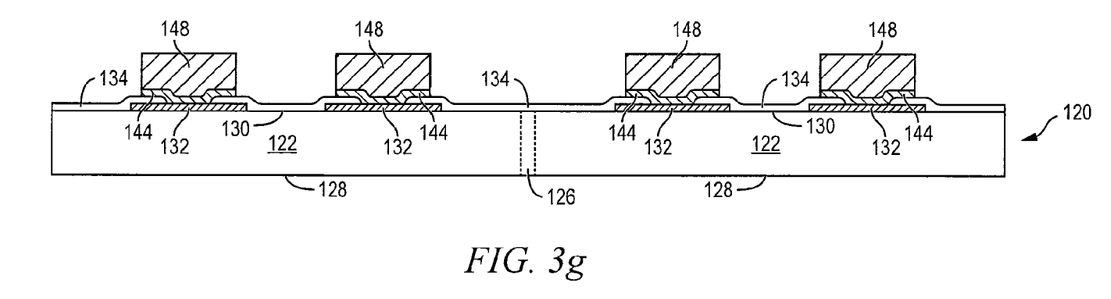

In FIG. 3g, photoresist layer 140 is removed by an etching process to leave individual conductive pillars 148. conductive pillars 148 have a height ranging from 2-120 micrometers (μm). Conductive pillars 148 can have a cylindrical shape with a circular or oval cross-section, or conductive pillars 148 can have a cubic shape with a rectangular cross-section. In another embodiment, conductive pillars 148 can be implemented with stacked bumps or stud bumps.

Figure 3H:
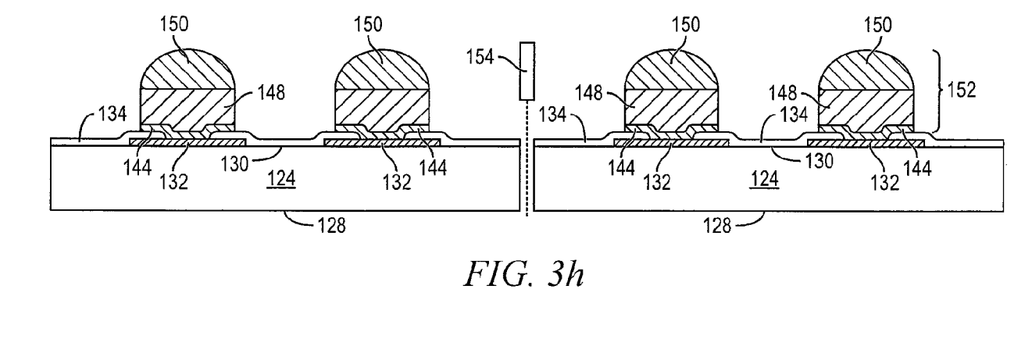

In FIG. 3h, an electrically conductive bump material is deposited over conductive pillars 148 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be reflowed to form a rounded bump cap 150. The combination of conductive pillars 148 and bump cap 150 constitute a composite interconnect 152 with a non-fusible portion (conductive pillar 148) and fusible portion (bump cap 150).

Semiconductor wafer 120 is singulated along saw street 126 with saw blade or laser cutting tool 154 into individual semiconductor die 124 with composite interconnect structures 152.

Figure 4A:
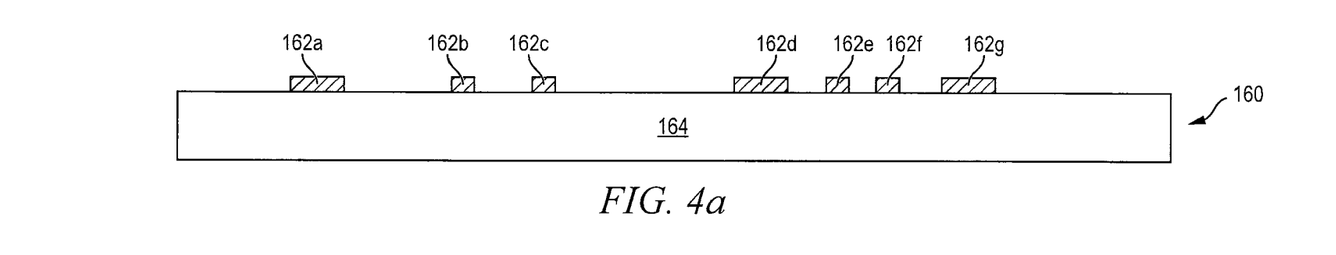
FIGS. 4a-4j illustrate a process of forming a sloped surface in a photoresist layer to enhance flow of underfill material between a semiconductor die and substrate.

FIGS. 4a-4j illustrate, in relation to FIGS. 1 and 2a-2c, a process of forming a sloped surface in a photoresist layer to enhance flow of underfill material between a semiconductor die and substrate. FIG. 4a shows a substrate or PCB 160 suitable for mounting semiconductor die 124. Substrate 160 contains one or more conductive layers 162a-162g formed on laminated insulating or dielectric layers 164. Substrate 160 can be silicon, germanium, gallium arsenide, indium phosphide, silicon carbide, polymer, beryllium oxide, or other suitable rigid material for structural support. Alternatively, insulating layers 164 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Conductive layer 162a-162g can be one or more layers of Al, Cu, Sn, Ni, Au, Ag, or other suitable electrically conductive material formed by electrolytic plating or electroless plating for electrical interconnect. The layout of conductive layer 162a-162g and insulating layers 164 typically uses silk screen printing, photoengraving, PCB milling, electroless plating, or electroplating process.

Figure 4B:
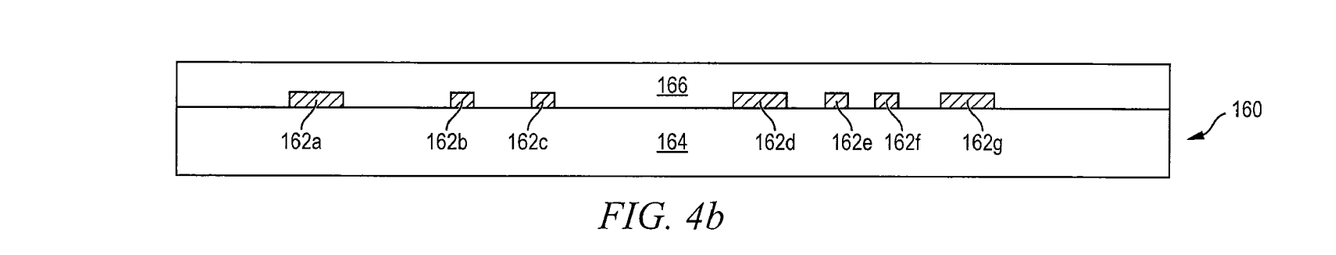

In FIG. 4b, a patterning or photoresist layer 166 is formed over substrate 160 and conductive layer 162a-162g using printing, spin coating, or spray coating. In one embodiment, patterning layer 166 is a dry film photoresist lamination with a thickness of 10-60 micrometers (μm). In other embodiments that utilize an insulating layer for patterning, the insulating layer can include one or more layers of SiO2, Si3N4, SiON, Ta2O5, Al2O3, or other material having similar structural properties.

Figure 4C:
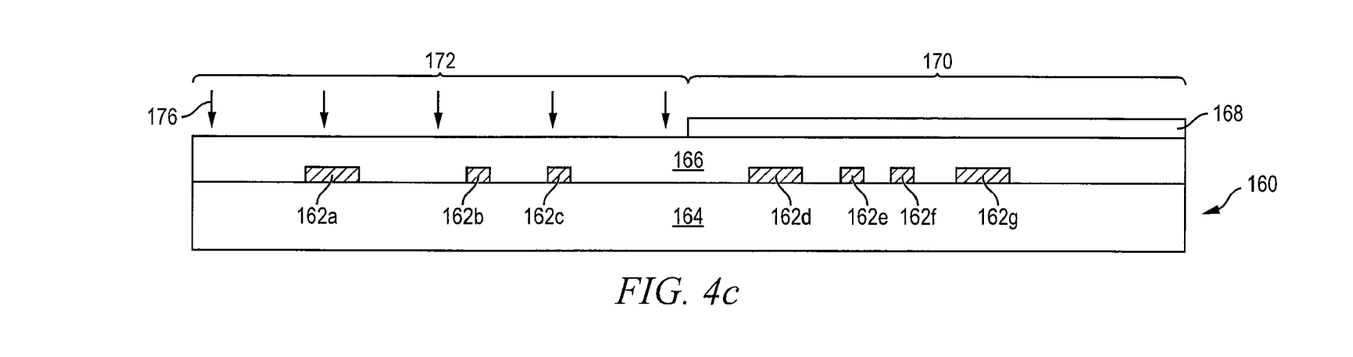
Figure 4D:
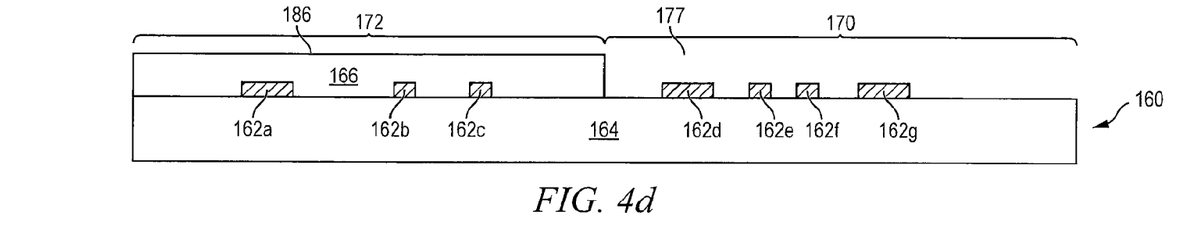

In FIG. 4c, a masking layer 168 is disposed over area 170 of substrate 160 designated for mounting semiconductor die 124. The exposed portion of photoresist layer 166 in area 172, i.e., not covered by making layer 168, is irradiated with ultraviolet (UV) light 176 to cure the photoresist layer. Masking layer 168 is removed and the non-irradiated portion of photoresist layer 160 is removed by an etching process to form an opening 177 and expose conductive layer 162d-162g and area 170 of substrate 160, as shown in FIG. 4d.

Figure 4E:
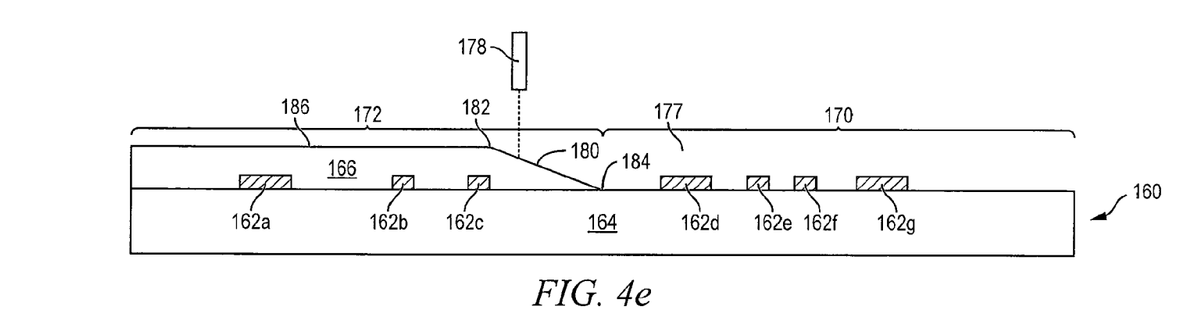
Figure 4F:
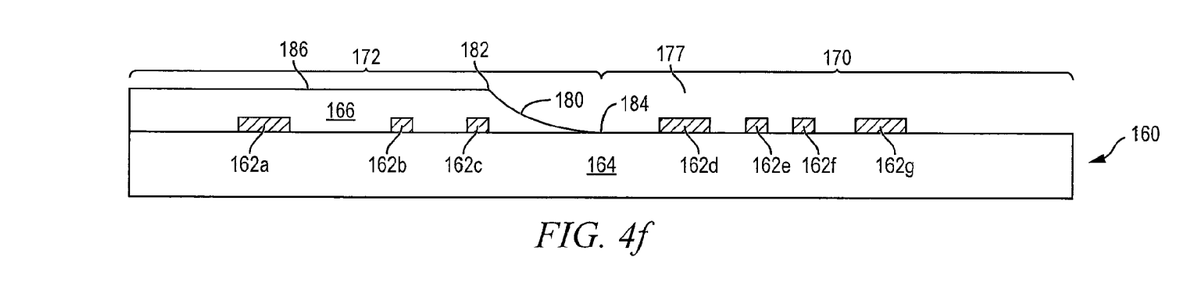
Figure 4G:
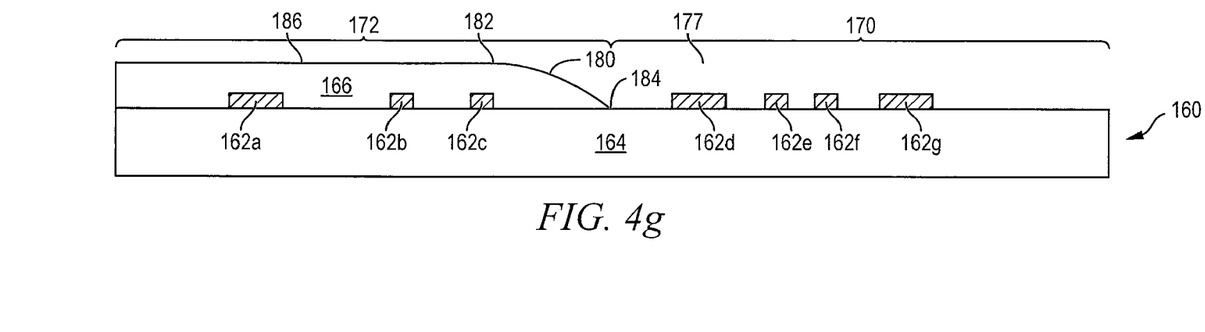

In FIG. 4e, a portion of photoresist layer 168 in area 172, between point 182 and point 184, is removed by laser direct ablation (LDA) using laser 178. In particular, the intensity or duration of laser 178 is controlled to create a gradual sloped surface 180 between point 182 and point 184 of photoresist layer 166 adjacent to opening 177. The sloped surface 180 in patterning layer 166 extends from surface 186 of patterning layer down to substrate 160. In one embodiment, sloped surface 180 of photoresist layer 166 between point 182 and point 184 has a 5-70 degree grade. The sloped surface 180 is linear between point 182 and point 184, given a 10-60 μm thickness of photoresist layer 166 and distance between point 182 and point 184 of 30-1500 μm. Alternatively, sloped surface 180 can be concave between point 182 and point 184, as shown in FIG. 4f, or convex between point 182 and point 184, as shown in FIG. 4g.

Figure 4H:
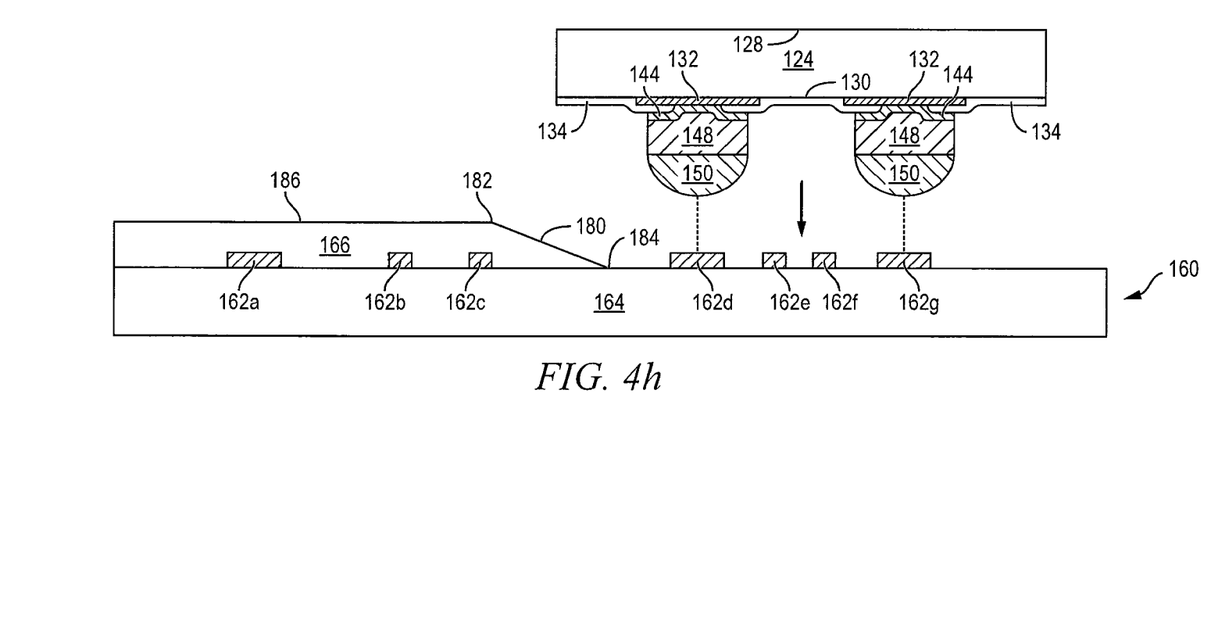
Figure 4I:
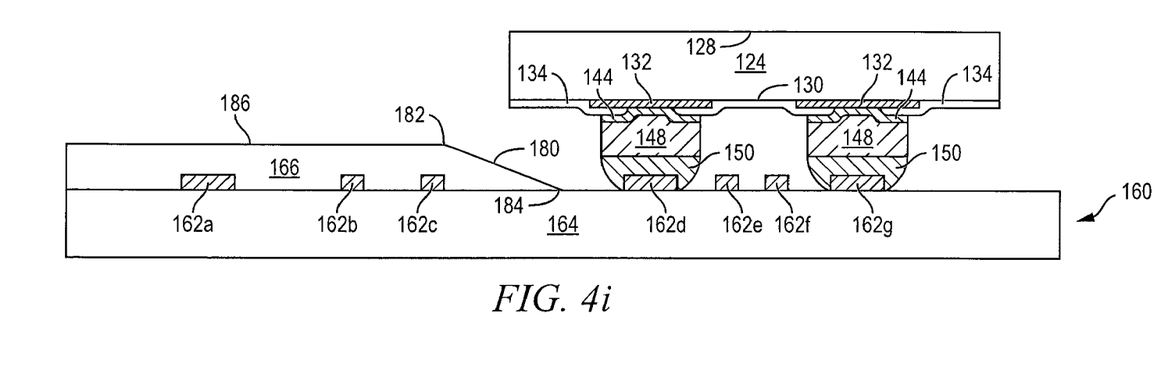

In FIG. 4h, semiconductor die 124 from FIGS. 3a-3f is positioned over and mounted to substrate 160 using a pick and place operation with active surface 130 oriented toward the substrate and composite interconnect structures 152 aligned with conductive layer 162d and 162g. FIG. 4i shows semiconductor die 124 mounted to substrate 160 with composite interconnect structures 152 electrically and metallurgically connected to conductive layer 162d and 162g. In particular, composite interconnect structures 152 have a width greater than a width of conductive layer 162d and 162g so that bump cap 150 covers the upper surface and sides surfaces of conductive layer 162d and 162g in a bump-on-lead configuration, while avoiding electrical contact with conductive layer 162e and 162f.

Figure 4J:
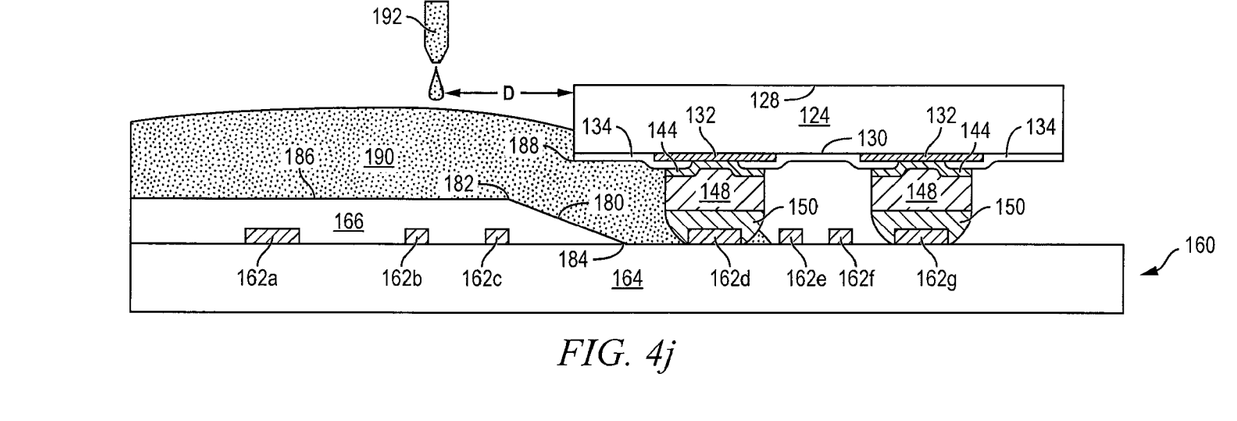

In FIG. 4j, an underfill material or molding compound 190 is deposited over photoresist layer 166 in area 172 using a paste printing, compressive molding, transfer molding, liquid encapsulant molding, vacuum lamination, spin coating, or other suitable applicator. In one embodiment, underfill material 190 is deposited with dispenser 192 at a distance D=0.1-1.5 millimeters (mm) from semiconductor die 124. Underfill material 190 can be polymer composite material, such as epoxy resin with filler, epoxy acrylate with filler, or polymer with proper filler. Underfill material 190 flows over photoresist layer 166 and down sloped surface 180 to cover the area between semiconductor die 124 and substrate 160 around composite interconnect structures 152. The gradual sloped surface 180 reduces surface tension between point 182 and 184 and enables the flow of underfill material 190 from surface 186 of photoresist layer 166 down the sloped surface to substrate 160 for uniform coverage between semiconductor die 124 and substrate 160, while reducing void formation in the underfill material. The sloped surface 180 also aids with the flow of underfill material 190 past edge 188 of semiconductor die 124. The gradual sloped surface 180 negates the problem introduced by the high surface tension existing at the abrupt edge of the SR layer, as described in the background, which reduces the flow of underfill material and creates non-uniform coverage and voids between the semiconductor die and substrate.

Figure 5:
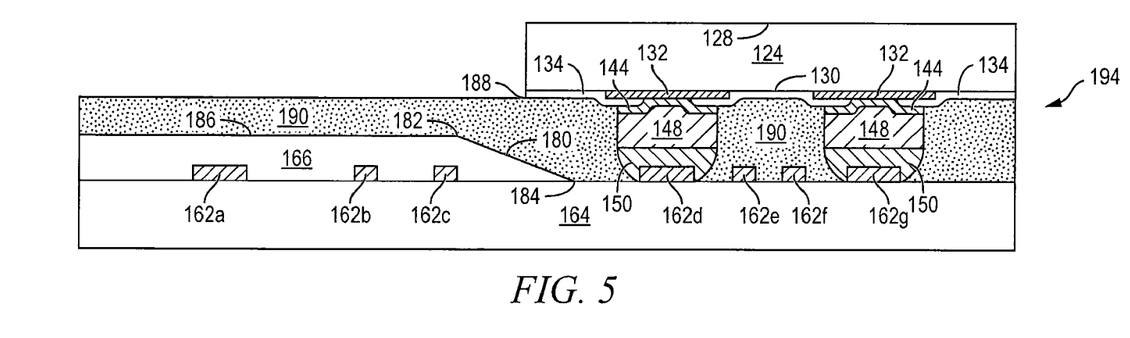
FIG. 5 illustrates a fcCuBE package with a sloped surface in the photoresist layer to enhance flow of underfill material between a semiconductor die and substrate.

FIG. 5 shows a flipchip semiconductor die with Cu column, bump on lead, and enhanced process (fcCuBE) package 194 with semiconductor die 124 electrically connected to conductive layer 162*d* and 162*g* of substrate 160. Underfill material 190 uniformly is deposited between semiconductor die 124 and substrate 160. The gradual sloped surface 180 reduces surface tension between point 182 and 184 to aid the flow of underfill material 190 from surface 186 down the sloped surface and past edge 188 of semiconductor die 124 for uniform coverage between semiconductor die 124 and substrate 160, while reducing void formation in the underfill material.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a plurality of composite bump structures over a surface of the semiconductor die;
   providing a substrate;
   forming a patterning layer over the substrate, the patterning layer including a surface opposite the substrate;
   removing a first portion of the patterning layer to form an opening to expose the substrate and conductive layer;
   removing a second portion of the patterning layer adjacent to the opening to form a sloped surface in the patterning layer, the sloped surface extending from the surface of the patterning layer down to the substrate;
   disposing the semiconductor die over the substrate; and
   depositing an underfill material over the surface of the patterning layer, wherein the underfill material flows down the sloped surface to cover an area between the semiconductor die and substrate around the composite bump structures.

2. The method of claim 1, wherein the sloped surface in the patterning layer is linear.

3. The method of claim 1, wherein the sloped surface in the patterning layer is concave or convex.

4. The method of claim 1, further including removing the second portion of the patterning layer by laser direct ablation.

5. The method of claim 1, wherein forming the composite bump structures includes:
   forming a conductive pillar over the semiconductor die; and
   forming a bump cap over the conductive pillar.

6. The method of claim 1, further including:
   forming a conductive layer over the substrate;
   bonding the composite bump structures to the conductive layer, wherein a width of the composite bump structure is greater than a width of the conductive layer.

7. A method of making a semiconductor device, comprising:
   providing a semiconductor die;
   providing a substrate;
   forming a patterning layer over the substrate, the patterning layer including a surface opposite the substrate;
   forming a sloped surface in the patterning layer extending from the surface of the patterning layer to the substrate;
   disposing the semiconductor die over the substrate; and
   depositing an underfill material over the surface of the patterning layer which flows down the sloped surface to cover an area between the semiconductor die and substrate.

8. The method of claim 7, wherein the sloped surface in the patterning layer is linear.

9. The method of claim 7, wherein the sloped surface in the patterning layer is concave or convex.

10. The method of claim 7, further including forming the sloped surface in the patterning layer by laser direct ablation.

11. The method of claim 7, further including:
    forming a conductive layer over the substrate;
    forming a bump structure over a surface of the semiconductor die; and
    disposing the semiconductor die over the substrate with the bump structure electrically connected to the conductive layer.

12. The method of claim 11, wherein forming the bump structure includes:
    forming a conductive pillar over the semiconductor die; and
    forming a bump cap over the conductive pillar.

13. The method of claim 11, wherein a width of the bump structure is greater than a width of the conductive layer.

14. A method of making a semiconductor device, comprising:
    providing a semiconductor die;
    providing a substrate;
    forming a patterning layer over the substrate, the patterning layer including a surface opposite the substrate;
    forming a sloped surface in the patterning layer extending from the surface of the patterning layer down to the substrate;
    disposing the semiconductor die over the substrate; and
    depositing an underfill material over the surface of the patterning layer which flows down the sloped surface to cover an area between the semiconductor die and substrate.

15. The method of claim 14, wherein the sloped surface in the patterning layer is linear, concave, or convex.

16. The method of claim 14, further including forming the sloped surface in the patterning layer by laser direct ablation.

17. The method of claim 14, further including:
    forming a conductive layer over the substrate;
    forming a bump structure over a surface of the semiconductor die; and
    disposing the semiconductor die over the substrate with the bump structure electrically connected to the conductive layer.

18. A method of making a semiconductor device, comprising:
    providing a semiconductor die;
    forming a bump structure over a surface of the semiconductor die, wherein forming the bump structure includes,
      (a) forming a conductive pillar over the semiconductor die, and
      (b) forming a bump cap over the conductive pillar;
    providing a substrate;
    forming a conductive layer over the substrate;
    forming a patterning layer over the substrate;
    forming a sloped surface in the patterning layer extending from a surface of the patterning layer down to the substrate;
    disposing the semiconductor die over the substrate with the bump structure electrically connected to the conductive layer;

and depositing an underfill material over the surface of the patterning layer.

19. The method of claim 17, wherein a width of the bump structure is greater than a width of the conductive layer.

20. A method of making a semiconductor device, comprising:
   providing a semiconductor die;
   providing a substrate;
   forming a patterning layer over the substrate, the patterning layer including a surface opposite the substrate and a sloped surface extending from the surface of the patterning layer to the substrate; and disposing the semiconductor die over the substrate; and
   depositing an underfill material over the surface of the patterning layer which flows down the sloped surface to cover an area between the semiconductor die and substrate.

21. The method of claim 20, wherein the sloped surface in the patterning layer is linear, concave, or convex.

22. The method of claim 20, further including forming the sloped surface in the patterning layer by laser direct ablation.

23. The method of claim 20, further including:
   forming a conductive layer over the substrate;
   forming a bump structure over a surface of the semiconductor die; and
   disposing the semiconductor die over the substrate with the bump structure electrically connected to the conductive layer.

24. The method of claim 23, wherein forming the bump structure includes:
   forming a conductive pillar over the semiconductor die; and
   forming a bump cap over the conductive pillar.

25. The method of claim 23, wherein a width of the bump structure is greater than a width of the conductive layer.

* * * * *